(12) United States Patent
Shin

(10) Patent No.: US 6,583,644 B2
(45) Date of Patent: Jun. 24, 2003

(54) OUTPUT BUFFER FOR REDUCING SLEW RATE VARIATION

(75) Inventor: Soon-kyun Shin, Sungnam (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/034,026

(22) Filed: Dec. 20, 2001

(65) Prior Publication Data

US 2002/0109525 A1 Aug. 15, 2002

(30) Foreign Application Priority Data

Feb. 14, 2001 (KR) .......................................... 2001-7274

(51) Int. Cl.[7] .............................................. H03K 17/16
(52) U.S. Cl. .............................. 326/26; 326/27; 326/57; 326/81
(58) Field of Search ............................. 326/26, 27, 57, 326/58, 81, 83, 84; 327/170, 112

(56) References Cited

U.S. PATENT DOCUMENTS

| | | | |
|---|---|---|---|
| 5,066,873 A | * 11/1991 | Chan et al. ................. | 307/443 |
| 5,440,258 A | * 8/1995 | Galbi et al. ................. | 327/112 |
| 6,348,814 B1 | * 2/2002 | Peterson ...................... | 326/58 |

* cited by examiner

*Primary Examiner*—Michael Tokar
*Assistant Examiner*—Anh Q Tran
(74) *Attorney, Agent, or Firm*—F. Chau & Associates, LLP

(57) ABSTRACT

An output buffer for buffering output data includes a bias voltage generator for generating first and second bias voltages responsive to a reference voltage, an output driver in signal communication with the bias voltage generator for driving an output terminal, a first slew rate controller in signal communication with the output driver for controlling a pull-up slew rate of the output driver in response to the output data and the first bias voltage, a second slew rate controller in signal communication with the output driver for controlling a pull-down slew rate of the output driver in response to the output data and the second bias voltage, and a slew rate compensator in signal communication with the output ends of the first and second slew rate controllers and the output terminal for compensating for slew rate variation in response to a change in the load capacitance of the output terminal.

18 Claims, 7 Drawing Sheets

OUTPUT BUFFER FOR REDUCING SLEW RATE VARIATION

BACKGROUND OF THE INVENTION

1. Field of the Invention

The present disclosure relates to a semiconductor integrated circuit, and more particularly, to an output buffer circuit of a semiconductor integrated circuit.

2. Description of the Related Art

In semiconductor integrated circuits, output buffer circuits are generally used to output internal data via an output terminal such as, for example, an output pad. As shown in FIG. 1, an output buffer circuit 10 includes an output driver 11 having a pull-up PMOS transistor P11 and a pull-down NMOS transistor N11; a first inverter 13 that inverts output data D, applies the inverted output data to the gate of the pull-up PMOS transistor P11, and controls the pull-up slew rate of the output driver 11; and a second inverter 15 that inverts the output data D, applies the inverted output data to the gate of the pull-down NMOS transistor N11, and controls the pull-down slew rate of the output driver 11.

In the output buffer circuit 10 illustrated in FIG. 1, the slew rate of the output driver 11 is determined based on the current flow charging the load capacitance of an output terminal 17 through the pull-up PMOS transistor P11, and the current flow discharged from the load capacitance of the output terminal 17 through the pull-down NMOS transistor N11.

These currents, which affect the slew rate of the output driver 11, vary considerably in the presence of process, voltage, and temperature (referred to as "PVT") variations. Accordingly, the slew rate of the output driver 11 also varies considerably in the presence of PVT variations.

In addition, the slew rate of the output driver 11 varies depending on the magnitude of the load capacitance of the output terminal 17. For example, if the load capacitance is increased by a factor of two, the slew rate of the output driver 11 generally increases by a corresponding factor of about two.

Unfortunately, in output buffer circuits such as, for example, that indicated by reference numeral 10 in FIG. 1, it is difficult to maintain a slew rate within a narrow tolerance under conditions in which the PVT and/or the load capacitance of the output terminal may vary.

SUMMARY OF THE INVENTION

These and other drawbacks and disadvantages are addressed by an output buffer for buffering output data while minimizing slew rate variations caused by PVT variations and/or changes in the load capacitance of an output terminal. Accordingly, an output buffer, usable in a semiconductor integrated circuit, is provided that includes a bias voltage generator for generating first and second bias voltages responsive to a reference voltage, an output driver in signal communication with the bias voltage generator for driving an output terminal, a first slew rate controller in signal communication with the output driver for controlling a pull-up slew rate of the output driver in response to the output data and the first bias voltage, a second slew rate controller in signal communication with the output driver for controlling a pull-down slew rate of the output driver in response to the output data and the second bias voltage, and a slew rate compensator in signal communication with the output ends of the first and second slew rate controllers and the output terminal for compensating for slew rate variation in response to a change in the load capacitance of the output terminal.

In a method of operation, the bias voltage generator generates first and second bias voltages using a reference voltage. The output driver drives an output terminal. The first slew rate controller controls the pull-up slew rate of the output driver in response to output data and the first bias voltage. The second slew rate controller controls the pull-down slew rate of the output driver in response to the output data and the second bias voltage. The slew rate compensator is connected to the output ends of the first and second slew rate controller and the output terminal and compensates for slew rate variation depending on the change in the load capacitance of the output terminal.

Preferred embodiments include those in which the output buffer circuit further includes a high voltage protector and a well voltage generator. If a voltage higher than a power supply voltage is applied to the output terminal, the high voltage protector drops the voltage and provides the dropped voltage to the output driver and the slew rate compensator. If a voltage higher than the power supply voltage is applied to the output terminal, the well voltage generator provides a voltage having substantially the same magnitude as the high voltage to the well of each PMOS transistor in the first and second slew rate controllers, the output driver, and the slew rate compensator.

These and other aspects, features and advantages of the present disclosure will become apparent from the following description of exemplary embodiments, which is to be read in connection with the accompanying drawings.

BRIEF DESCRIPTION OF THE DRAWINGS

Features and advantages of the present disclosure will become more apparent in light of the following description, with references to the attached drawings, in which.

DETAILED DESCRIPTION OF PREFERRED EMBODIMENTS

Figure 1:
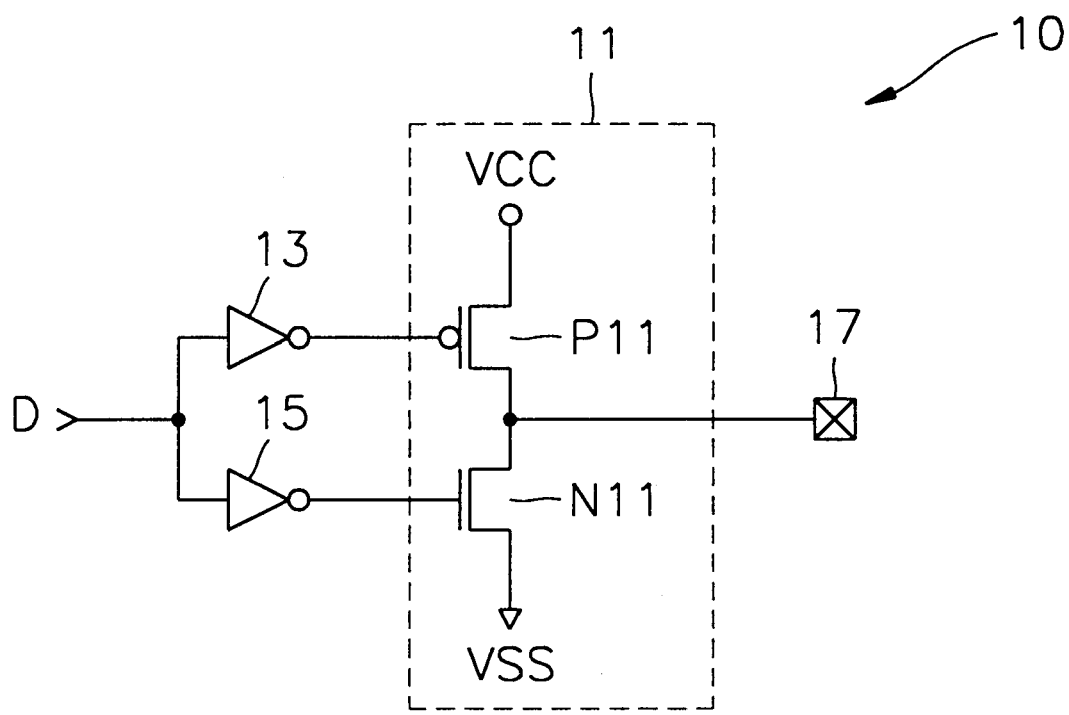
FIG. 1 shows a circuit diagram for an output buffer circuit.

The present disclosure is described below with reference to the accompanying drawings, in which an exemplary embodiment is shown. Like features are indicated by like reference numerals in the several Figures, obviating duplicative description.

Figure 2:
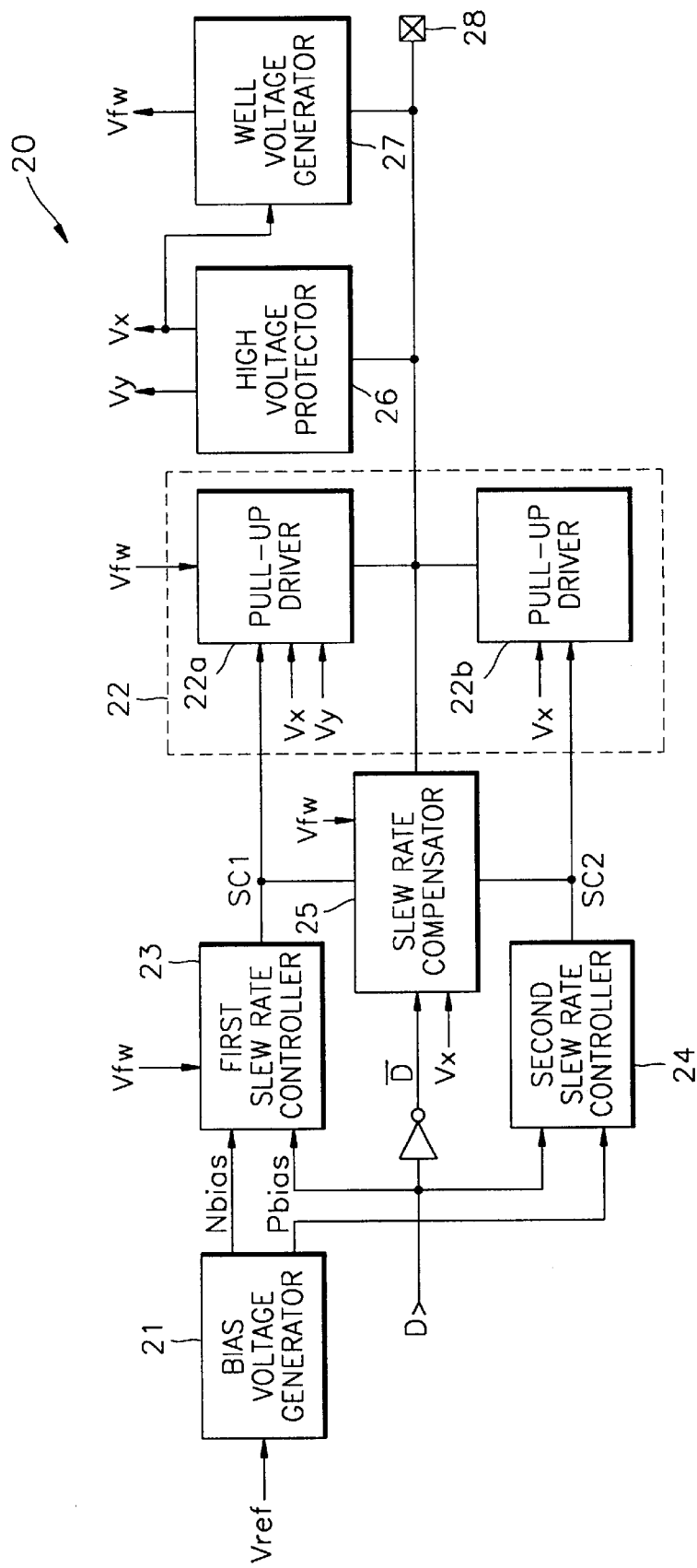
FIG. 2 shows a circuit diagram for an output buffer circuit according to an embodiment of the present disclosure.

Referring to FIG. 2, an output buffer circuit according to an embodiment of the present disclosure is indicated generally by the reference numeral 20. The output buffer circuit 20 includes a bias voltage generator 21, an output driver 22 in signal communication with the voltage generator 21, a first slew rate controller 23 in signal communication with the voltage generator 21, a second slew rate controller 24 in signal communication with the voltage generator 21, a slew rate compensator 25 in signal communication with the first slew rate controller 23 and the second slew rate controller 24, a high voltage protector 26 in signal communication with the slew rate compensator 25, and a well voltage generator 27 in signal communication with the high voltage protector 26 and the slew rate compensator 25.

The bias voltage generator 21 generates first and second bias voltages, Nbias and Pbias, using a reference voltage Vref. The first slew rate controller 23 controls the pull-up slew rate of the output driver 22 in response to output data D and the first bias voltage Nbias, and the second slew rate controller 24 controls the pull-down slew rate of the output driver 22 in response to the output data D and the second bias voltage Pbias. The output driver 22 includes a pull-up driver 22a and a pull-down driver 22b and drives an output terminal 28, such as, for example, an output pad, in response to an output signal SC1 of the first slew rate controller 23 and an output signal SC2 of the second slew rate controller 24.

The slew rate compensator 25 is connected to the output end of each of the first and second slew rate controllers 23 and 24 and compensates for slew rate variations caused by the change in the load capacitance of the output terminal 28. When a voltage higher than a power supply voltage is applied to the output terminal 28, the high voltage protector 26 reduces the high voltage in order to protect a gate oxide layer of each transistor and provides the reduced voltage Vx and Vy to the output driver 22 and the slew rate compensator 25. When a voltage higher than the power supply voltage is applied to the output terminal 28, the well voltage generator 27 provides a voltage Vfw having substantially the same magnitude as the high voltage to the floating well of each PMOS transistor in the first and second slew rate controllers 23 and 24, the output driver 22, and the slew rate compensator 25.

Figure 3:
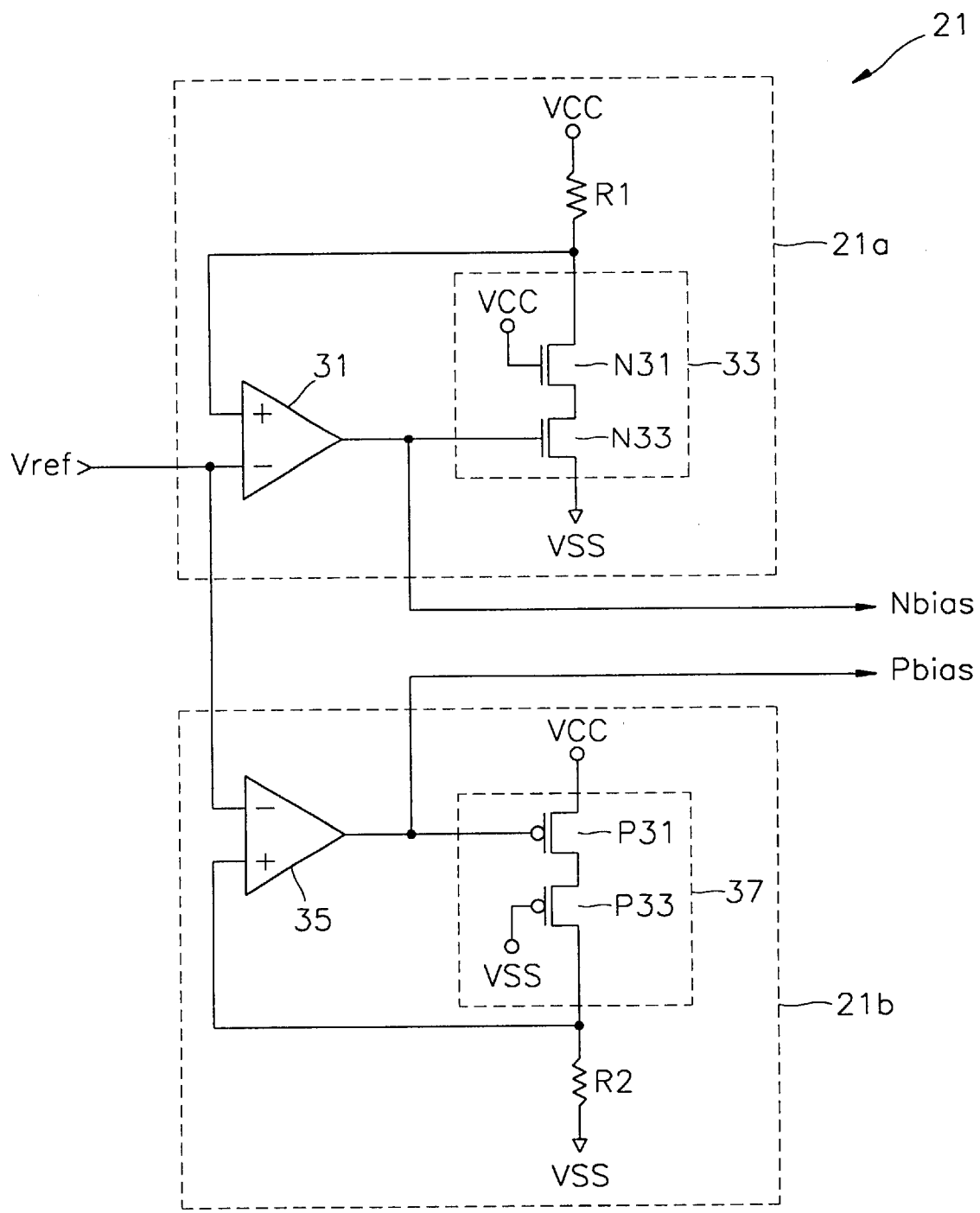
FIG. 3 shows a circuit diagram for the bias voltage generator of FIG. 2.

Turning now to FIG. 3, the bias voltage generator 21 includes a first bias voltage generator 21a generating a first bias voltage Nbias using a reference voltage Vref and a second bias voltage generator 21b generating a second bias voltage Pbias using the reference voltage Vref.

The first bias voltage generator 21a includes a resistor R1, an amplifier 31, and a current source 33. One end of the resistor R1 is connected to a power supply voltage VCC. The amplifier 31 compares a feed back voltage, that is, the voltage at the other end of the resistor R1, with the reference voltage Vref and generates the first bias voltage Nbias based on comparison results. The current source 33 is connected between the other end of the resistor R1 and a ground voltage VSS and lets current flow in response to the first bias voltage Nbias.

Here, the current source 33 includes NMOS transistors N31 and N33 and forms a current mirror with NMOS transistors N41 and N43 of the first slew rate controller 23, as will be described with respect to FIG. 4.

The second bias voltage generator 21b includes a resistor R2, an amplifier 35, and a current source 37. One end of the resistor R2 is connected to the ground voltage VSS. The amplifier 35 compares the voltage at the other end of the resistor R2 with the reference voltage Vref and outputs the second bias voltage Pbias based on comparison results.

The current source 37 is connected between the other end of the resistor R2 and the power supply voltage VCC and lets current flow in response to the second bias voltage Pbias. Here, the current source 37 includes PMOS transistors P31 and P33 and forms a current mirror with PMOS transistors P51 and P53 of the second slew rate controller 24, as will be described with respect to FIG. 5.

In operation of the first bias voltage generator 21a, a predetermined amount of current, irrespective of PVT variations, is allowed to flow through the resistor R1 based on the reference voltage Vref, which has a constant value irrespective of PVT variations. At this time, the output voltage of the amplifier 31 is the first bias voltage Nbias.

In the second bias voltage generator 21b, a predetermined amount of current, irrespective of PVT variations, is allowed to flow through the resistor R2 based on the reference voltage Vref, which has constant value irrespective of PVT variations. At this time, the output voltage of the amplifier 35 is the second bias voltage Pbias.

Figure 4:
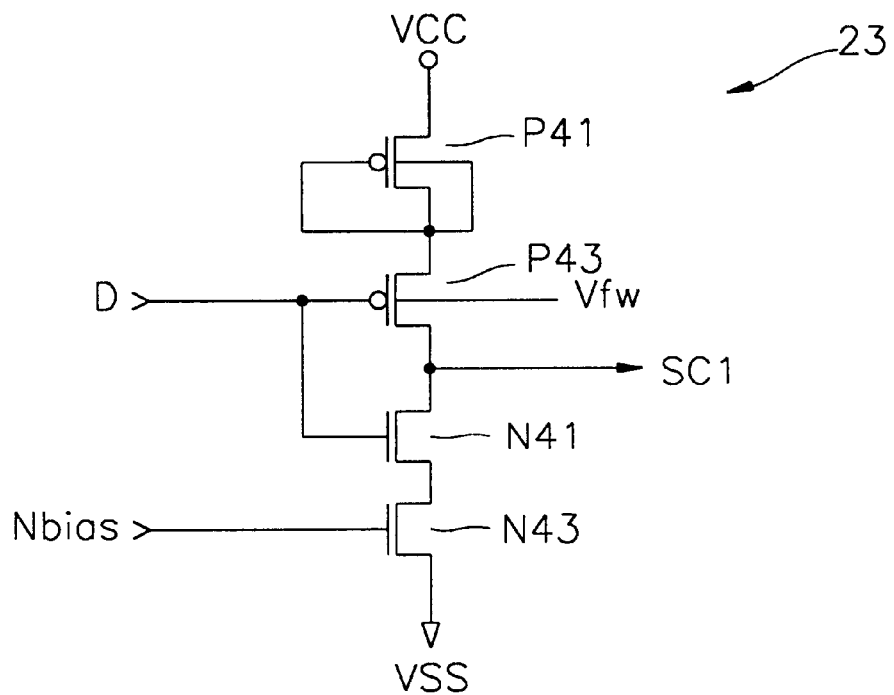
FIG. 4 shows a circuit diagram for the first slew rate controller of FIG. 2.

FIG. 4 shows a circuit diagram of the first slew rate controller 23 as introduced in FIG. 2. Referring to FIG. 4, the first slew rate controller 23 implements an inverter for inverting the output data D in response to the first bias voltage and outputting the inverted output data ~D to the output end SC1. The first slew rate controller 23 includes a PMOS transistor P41, a PMOS transistor P43, an NMOS transistor N41, and an NMOS transistor N43. The output voltage Vfw of the well voltage generator 27, shown in FIG. 2, is applied to the bulk of the PMOS transistor P43.

Figure 5:
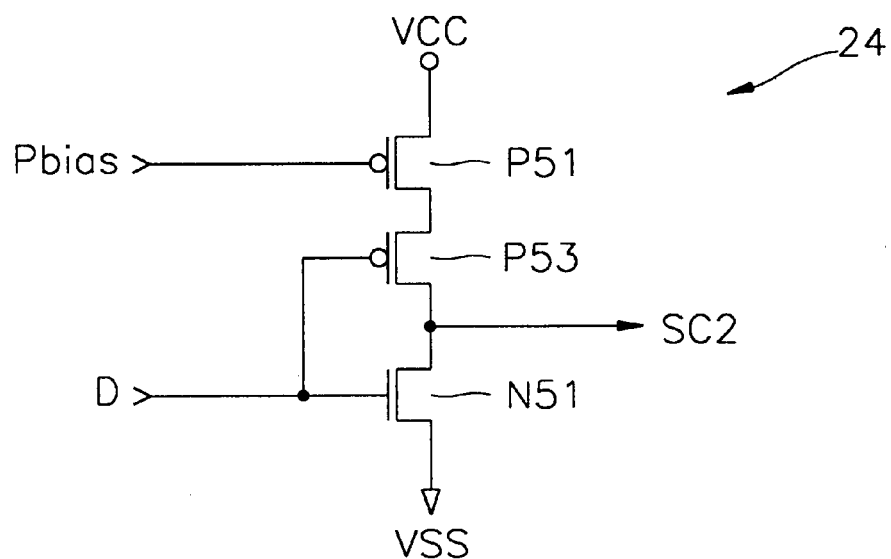
FIG. 5 shows a circuit diagram for the second slew rate controller of FIG. 2.

FIG. 5 shows a circuit diagram of the second slew rate controller 24 as introduced in FIG. 2. Referring to FIG. 5, the second slew rate controller 24 implements an inverter for inverting the output data D in response to the second bias voltage Pbias and outputting the inverted output data ~D to the output end SC2. The second slew rate controller 24 includes a PMOS transistor P51, a PMOS transistor P53, and an NMOS transistor N51.

Figure 6:
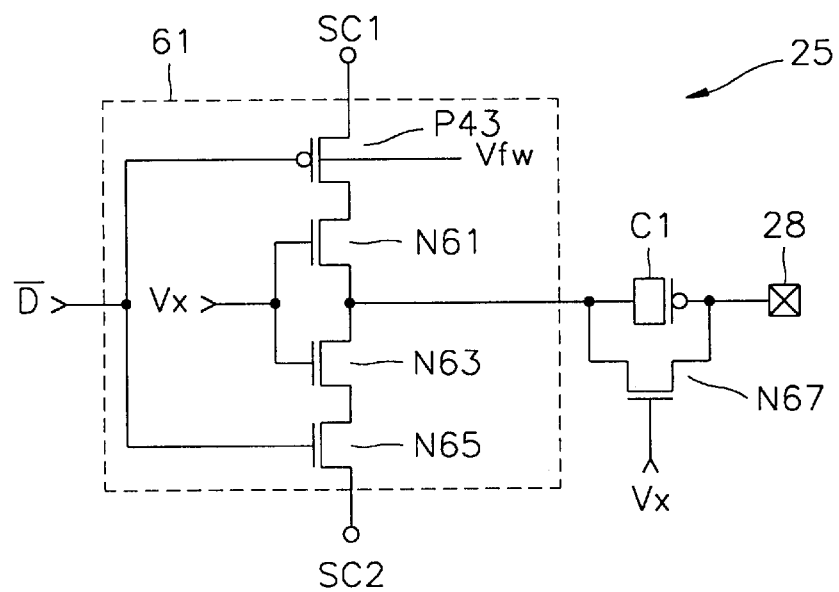
FIG. 6 shows a circuit diagram for the slew rate compensator of FIG. 2.

FIG. 6 shows a circuit diagram of the slew rate compensator 25 as introduced in FIG. 2. Referring to FIG. 6, the slew rate compensator 25 includes a capacitor C1, a switching unit 61, and a switching device N67. The capacitor C1 and the switching device N67 are connected in parallel between the output terminal 28 and the switching unit 61.

The switching device N67 includes an NMOS transistor. The switching device N67 bypasses the capacitor C1 in response to an output signal Vx of the high voltage protector 26 and connects the output terminal 28 to the output end of the switching unit 61.

The switching unit 61 is enabled or disabled in response to the output signal Vx of the high voltage protector 26. When the inverted output data ~D is logic "low", the switching unit 61 connects the other end of the capacitor C1 to the output end SC1 of the first slew rate controller 23.

When the inverted output data ~D is logic "high", the switching unit 61 connects the other end of the capacitor C1 to the output end SC2 of the second slew rate controller 24. Here, the switching unit 61 includes a PMOS transistor P61 and NMOS transistors N61, N63, and N65. The output voltage Vfw of the well voltage generator 27 shown in FIG. 2 is applied to the bulk of the PMOS transistor P61.

Figure 7:
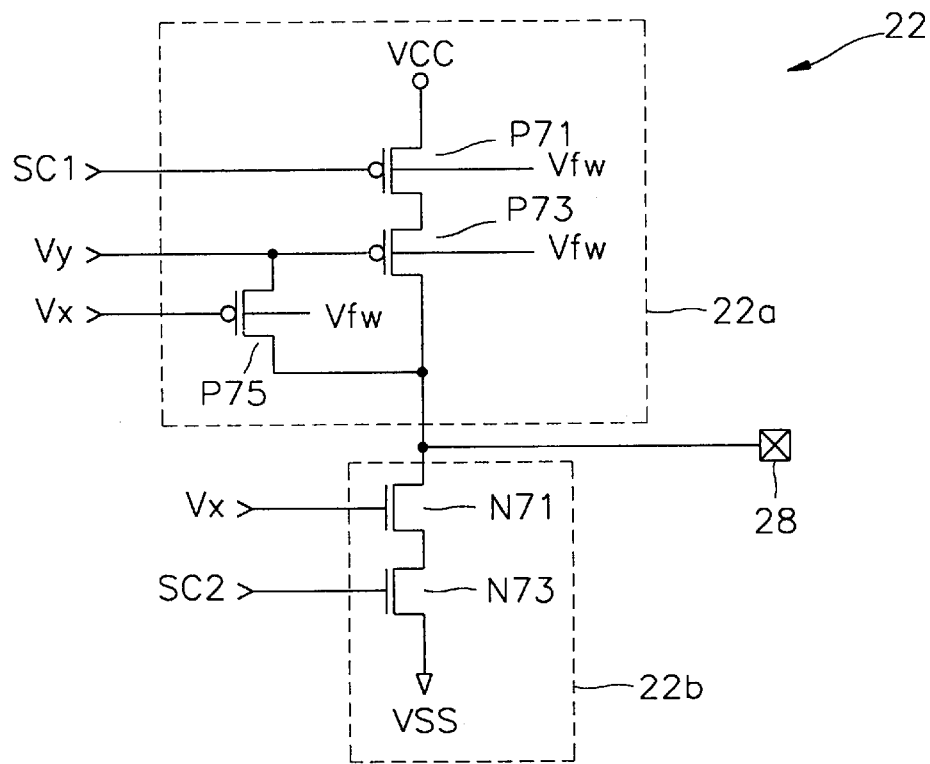
FIG. 7 shows a circuit diagram for the output driver of FIG. 2.

Turning now to FIG. 7, a circuit diagram is shown of the output driver 22 as introduced in FIG. 2. Referring to FIG. 7, the output driver 22 includes a pull-up driver 22a for pulling-up the output terminal 28 in response to the output signal Vy of the high voltage protector 26 and the output signal SC1 of the first slew rate controller 23 and a pull-down driver 22b for pulling down the output terminal 28 in response to the output signal Vx of the high voltage protector 26 and the output signal SC2 of the second slew rate controller 24.

The pull-up driver 22a includes PMOS transistors P71 and P73 connected in series between the power supply voltage VCC and the output terminal 28. The pull-down driver 22b includes NMOS transistors N71 and N73 connected in series between the output terminal 28 and the ground voltage VSS.

A PMOS transistor P75 responding to the output signal Vx of the high voltage protector 26 is connected between the output terminal 28 and the gate of the PMOS transistor P73. The PMOS transistor P75 is introduced to protect a gate oxide layer of the PMOS transistor P73.

Thus, if a voltage higher than the power supply voltage VCC, such as, for example, 5 Volts, is applied to the output terminal 28, the PMOS transistor P75 is turned on. Accordingly, 5 Volts is also applied to the gate of the PMOS transistor P73, and thus the gate oxide layer of the PMOS transistor P73 can be protected. The output voltage of the well voltage generator 27 is applied to the bulk of each of the PMOS transistors P71, P73, and P75.

Figure 8:
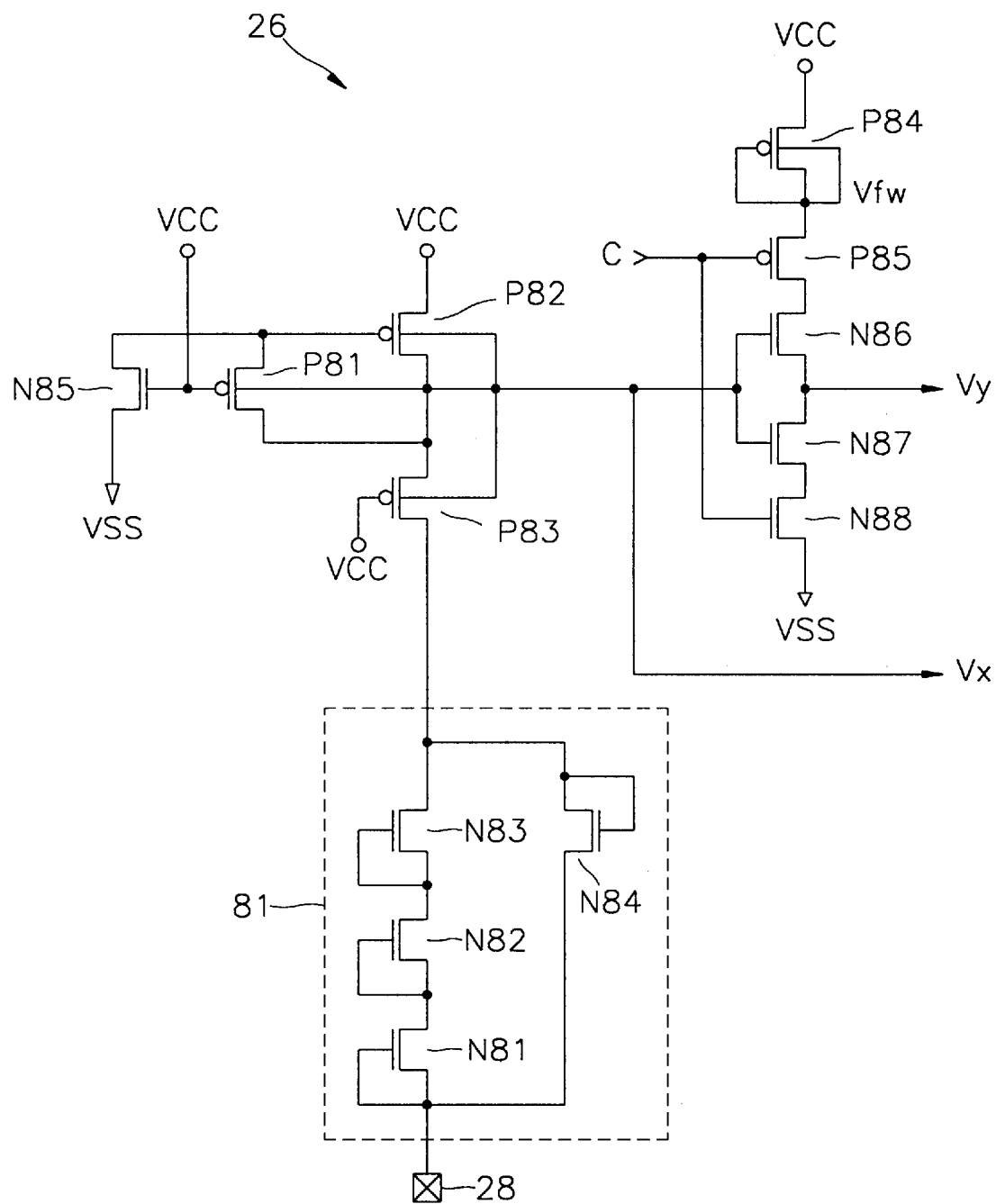
FIG. 8 shows a circuit diagram for the high voltage protector of FIG. 2.

FIG. 8 shows a circuit diagram of the high voltage protector 26 as introduced in FIG. 2. Referring to FIG. 8, when a voltage higher than the power supply voltage VCC is applied to the output terminal 28, the high voltage protector 26 drops the high voltage in order to protect the gate oxide layer of each transistor and then provides the dropped voltage Vx and Vy to the output driver 22 and the slew rate compensator 25. The high voltage protector 26 includes a voltage dropper 81, PMOS transistors P81 through P85, and NMOS transistors N85 through N88. The voltage dropper 81 includes diode-type NMOS transistors N81 through N84.

In operation, when the power supply voltage VCC is supplied, such as, for example, when the power supply voltage VCC is 3.3 Volts, the NMOS transistor N85 is turned on and the PMOS transistors P81 and P83 are turned off. Accordingly, the PMOS transistor P82 is turned on. Thus, the output signal Vx is 3.3 Volts irrespective of the voltage applied to the output terminal 28.

When the power supply voltage VCC is not supplied, or when the power supply voltage VCC is zero Volts, the NMOS transistor N85 is turned off and the PMOS transistors P81 and P83 are turned on. Accordingly, the PMOS transistor P82 is turned off.

As a result, when a voltage higher than the power supply voltage VCC, such as, for example, a voltage of 5 Volts, is applied to the output terminal 28, the voltage dropper 81 drops the voltage of 5 Volts, and thus the output signal Vx is about 3.3 Volts. In other words, the output signal Vx is always 3.3 Volts irrespective of whether or not the power supply voltage VCC is supplied.

Figure 9:
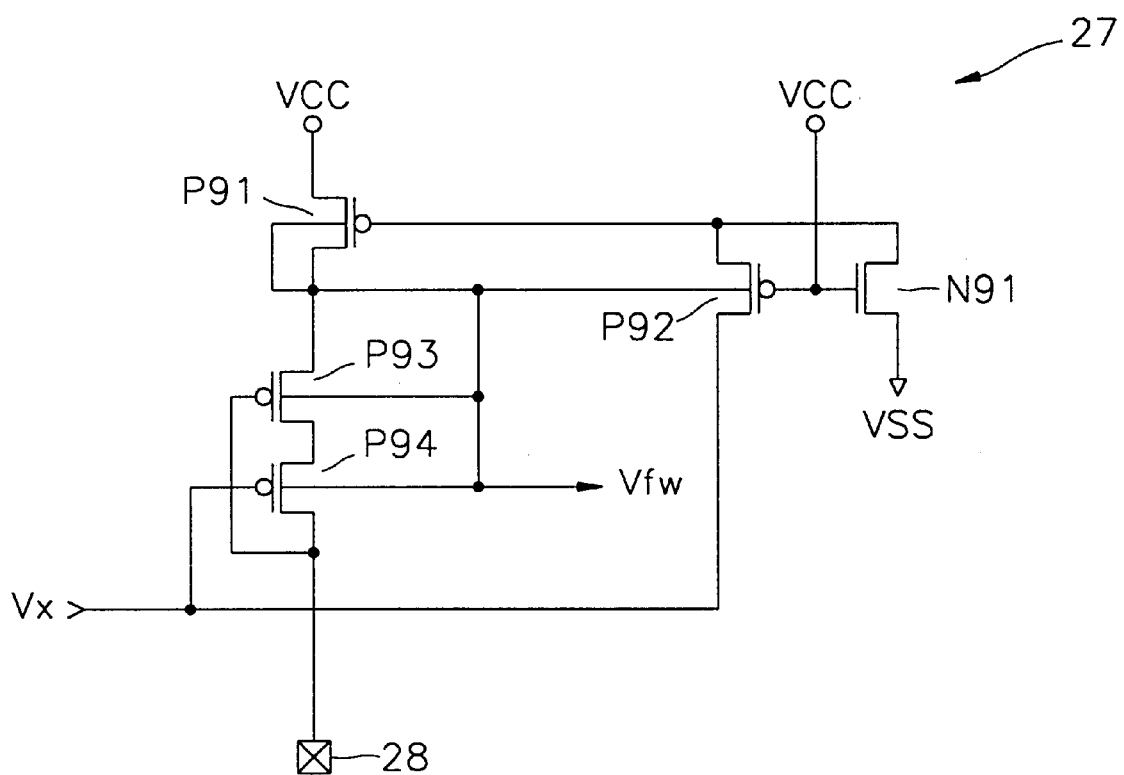
FIG. 9 shows a circuit diagram for the well voltage generator of FIG. 2.

FIG. 9 shows a circuit diagram of the well voltage generator 27 as introduced in FIG. 2. Referring to FIG. 9, the well voltage generator 27 is introduced to provide a predetermined voltage to the floating well of each PMOS transistor in the first and second slew rate controllers 23 and 24, the output driver 22, and the slew rate compensator 25. The well voltage generator 27 includes PMOS transistors P91 through P94 and an NMOS transistor N91.

In operation as described above, the output signal Vx is 3.3 Volts irrespective of whether the power supply voltage VCC is supplied, and thus if a voltage no less than 3.3 Volts is applied to the output terminal 28, the output voltage Vfw reaches the same level as the voltage applied to the output terminal 28. In other words, the output voltage Vfw is substantially equal to the voltage applied to the output terminal 28 irrespective of whether or not the power supply voltage VCC is supplied.

In operation, a slew rate control method is performed for the output buffer circuit 20 based on the functions of the above-described elements and features of the output buffer circuit 20. The pull-up slew rate of the output driver 22 is controlled by a signal at the output end SC1 of the first slew rate controller 23.

A predetermined amount of current, irrespective of PVT variations, is supplied to the output end SC1 of the first slew rate controller 23 by the first bias voltage Nbias, which can be compensated for depending on PVT variations. Accordingly, the signal of the output end SC1 increases or decreases with a predetermined slope, irrespective of PVT variations, and finally, the change in the pull-up slew rate of the output driver 22 caused by PVT variations is minimized.

In addition, the pull-down slew rate of the output driver 22 is controlled by a signal at the output end SC2 of the second slew rate controller 24. A predetermined amount of current is supplied to the output end SC2 of the second slew rate controller 24 by the second bias voltage Pbias, which can be compensated for depending on PVT variations. Accordingly, the signal of the output end SC2 increases or decreases with a predetermined slope, irrespective of PVT variations, and finally, the change in the pull-down slew rate of the output driver 22 caused by PVT variations is minimized.

When the output data D is logic "high", in other words, when the inverted output data ~D is logic "low", the capacitor C1 of the slew rate compensator 26 shown in FIG. 6 is connected to the output end SC1 of the first slew rate controller 23, in which case the capacitor C1 acts as Miller capacitance to the output end SC1. In addition, when the output data D is logic "low", in other words, when the inverted output data ~D is logic "high", the capacitor C1 of the slew rate compensator 25 is connected to the output end SC2 of the second slew rate controller 24, in which case the capacitor C1 acts as Miller capacitance to the output end SC2.

Accordingly, if the slew rate of a signal of the output terminal 28 is varied due to the change in the load capacitance of the output terminal 28, the varied slew rate is well compensated for by the slew rate compensator 25. In other words, slew rate variation caused by the change in the load capacitance of the output terminal 28 can be minimized.

As described above, the output buffer circuit according to the present disclosure is capable of minimizing slew rate variation and protecting the gate oxide layer of each transistor even if a voltage higher than a power supply voltage is applied to an output terminal.

Although the illustrative embodiments have been described herein with reference to the accompanying drawings, it is to be understood that the present disclosure is not limited to those precise embodiments, and that various changes and modifications may be affected therein by one of ordinary skill in the pertinent art without departing from the scope or spirit of the present disclosure. All such changes and modifications are intended to be included within the scope of the present disclosure as set forth in the appended claims.

What is claimed is:

1. An output buffer circuit for buffering output data, the circuit comprising:

a bias voltage generator for generating first and second bias voltages responsive to a reference voltage;

an output driver in signal communication with said bias voltage generator for driving an output terminal;

a first slew rate controller in signal communication with said output driver for controlling a pull-up slew rate of said output driver in response to said output data and said first bias voltage;

a second slew rate controller in signal communication with said output driver for controlling a pull-down slew rate of said output driver in response to said output data and said second bias voltage;

a slew rate compensator in signal communication with the output ends of said first and second slew rate controllers and said output terminal for compensating for slew rate variation in response to a change in the load capacitance of the output terminal; and a high voltage protector for dropping a voltage applied to the output terminal and providing the dropped voltage to the output driver and the slew rate compensator if a voltage higher than a power supply voltage is applied to the output terminal.

2. An output buffer circuit as defined in claim 1, further comprising a well voltage generator for providing a voltage having substantially the same magnitude as a high voltage to the well of each PMOS transistor in the first and second slew rate controllers, the output driver, and the slew rate compensator, if the high voltage applied to the output terminal is higher than the power supply voltage.

3. An output buffer circuit as defined in claim 1 wherein the bias voltage generator comprises:

a first bias voltage generator for generating the first bias voltage using the reference voltage; and a second bias voltage generator for generating the second bias voltage using the reference voltage.

4. An output buffer circuit as defined in claim 3 wherein the first bias voltage generator comprises:

a resistor having first and second ends wherein the first end is connected to the power supply voltage;

an amplifier for comparing the voltage of the second end of the resistor with the reference voltage and outputting the first bias voltage based on comparison results; and a current source connected between the second end of the resistor and ground voltage for allowing current to flow in response to the first bias voltage.

5. An output buffer circuit as defined in claim 3 wherein the second bias voltage generator comprises:

a resistor having first and second ends wherein the first end is connected to the ground voltage;

an amplifier which compares the voltage of the second end of the resistor with the reference voltage and outputs the second bias voltage based on comparison results; and a current source that is connected between the second end of the resistor and the power supply voltage and allows current to flow in response to the second bias voltage.

6. An output buffer circuit as defined in claim 1 wherein the first slew rate controller comprises an inverter for inverting the output data in response to the first bias voltage and outputting inverted output data to the output terminal.

7. An output buffer circuit as defined in claim 1 wherein the second slew rate controller comprises an inverter for inverting the output data in response to the second bias voltage and outputting inverted output data to the output terminal.

8. An output buffer circuit as defined in claim 1 wherein the slew rate compensator comprises:

a capacitor, one end of which is connected to the output terminal;

a switching unit that is enabled or disabled in response to the output signal of the high voltage protector for connecting the other end of the capacitor to the output end of the first slew rate controller when the output data is in a first logic state, and connecting the other end of the capacitor to the output end of the second slew rate controller when the output data is in a second logic state; and a switching device that connects one end of the capacitor to the other end of the capacitor in response to the output signal of the high voltage protector.

9. An output buffer circuit as defined in claim 1 wherein the output driver comprises:

a pull-up driver for pulling up the output terminal in response to the output signal of the high voltage protector and the output signal of the first slew rate controller; and a pull-down driver for pulling down the output terminal in response to the output signal of the high voltage protector and the output signal of the second slew rate controller.

10. An output buffer circuit as defined in claim 1 wherein the high voltage protector comprises:

a voltage dropper for dropping a high voltage applied to the output terminal;

an NMOS transistor with the gate connected to the power supply voltage and the source connected to the ground voltage;

a first PMOS transistor having the gate connected to the power supply voltage and one of the drain and the source connected to the drain of the NMOS transistor;

a second PMOS transistor having the source connected to the ground voltage, the gate connected to the drain of the NMOS transistor, the drain connected to one of the source and the drain of the first PMOS transistor; and a third PMOS transistor having one of the source and the drain connected to the drain of the second PMOS transistor, the other of the source and the drain connected to the voltage dropper, and the gate connected to the power supply voltage, wherein the drain of the second PMOS transistor is connected to the bulk of each of the first, second and third PMOS transistors.

11. An output buffer circuit as defined in claim 2 wherein the well voltage generator comprises:

an NMOS transistor having the gate connected to the power supply voltage and the source connected to the ground voltage;

a first PMOS transistor having the source connected to the power supply voltage and the gate connected to the drain of the NMOS transistor;

a second PMOS transistor having the gate connected to the power supply voltage, one of the source and the drain connected to the drain of the NMOS transistor, and the other of the source and the drain connected to the output signal of the high voltage protector;

a third PMOS transistor having one of the source and the drain connected to the drain of the first PMOS transistor and the gate connected to the output terminal; and a fourth PMOS transistor having one of the source and drain connected to one of the source and the drain of the third PMOS transistor, the gate connected to the output signal of the high voltage protector, and the other of the source and drain connected to the output terminal.

12. A method for buffering output data, the method comprising:

generating first and second bias voltages responsive to a reference voltage;

driving an output in response to said generated voltages;

controlling a pull-up slew rate of said driven output in response to said output data and said first bias voltage;

controlling a pull-down slew rate of said driven output in response to said output data and said second bias voltage;

compensating for slew rate variation in response to a change in the load capacitance of said driven output;

applying said driven output to said output terminal;

dropping a voltage applied to said output terminal; and detecting if a voltage higher than a power supply voltage is applied to said output terminal.

13. A method as defined in claim 12, further comprising:

providing a voltage having substantially the same magnitude as a high voltage to the wells of a plurality of transistors if the high voltage applied to the output terminal is higher than the power supply voltage.

14. A method as defined in claim 12, further comprising:

inverting the output data in response to the first bias voltage; and outputting the inverted output data to the output terminal.

15. A method as defined in claim 12, further comprising:

inverting the output data in response to the second bias voltage; and outputting the inverted output data to the output terminal.

16. An output buffer circuit for buffering output data, the circuit comprising:

means for generating first and second bias voltages responsive to a reference voltage;

means for driving an output in response to said generated voltages;

means for controlling a pull-up slew rate of said driven output in response to said output data and said first bias voltage;

means for controlling a pull-down slew rate of said driven output in response to said output data and said second bias voltage;

means for compensating for slew rate variation in response to a change in the load capacitance of said driven output;

means for applying said driven output to an output terminal;

means for dropping a voltage applied to said output terminal; and means for detecting if a voltage higher than a power supply voltage is applied to said output terminal.

17. An output buffer circuit as defined in claim 16, further comprising:

means for providing a voltage having substantially the same magnitude as a high voltage to the wells of a plurality of switching devices if the high voltage applied to the output terminal is higher than the power supply voltage.

18. A semiconductor integrated circuit comprising an output buffer circuit for buffering output data, the output buffer circuit comprising:

a bias voltage generator for generating first and second bias voltages responsive to a reference voltage;

an output driver in signal communication with said bias voltage generator for driving an output terminal;

a first slew rate controller in signal communication with said output driver for controlling a pull-up slew rate of said output driver in response to said output data and said first bias voltage;

a second slew rate controller in signal communication with said output driver for controlling a pull-down slew rate of said output driver in response to said output data and said second bias voltage;

a slew rate compensator in signal communication with the output ends of said first and second slew rate controllers and said output terminal for compensating for slew rate variation in response to a change in the load capacitance of the output terminal; and a high voltage protector for dropping a voltage applied to the output terminal and providing the dropped voltage to the output driver and the slew rate compensator if a voltage higher than a power supply voltage is applied to the output terminal.

* * * * *